(12) United States Patent
Geng et al.

(10) Patent No.: US 10,985,743 B2
(45) Date of Patent: Apr. 20, 2021

(54) LOW-POWER-CONSUMPTION HIGH-SPEED ZERO-CURRENT SWITCH

(71) Applicant: XI'AN JIAOTONG UNIVERSITY, Shaanxi (CN)

(72) Inventors: Li Geng, Shaanxi (CN); Zhongming Xue, Shaanxi (CN); Lina Zhang, Shaanxi (CN); Wei Gou, Shaanxi (CN); Rui Zhang, Shaanxi (CN); Ruiqiang Zhang, Shaanxi (CN)

(73) Assignee: XI'AN JIAOTONG UNIVERSITY, Shaanxi (CN)

( * ) Notice: Subject to any disclaimer, the term of this patent is extended or adjusted under 35 U.S.C. 154(b) by 0 days.

(21) Appl. No.: 16/616,673

(22) PCT Filed: May 25, 2018

(86) PCT No.: PCT/CN2018/088421
§ 371 (c)(1),
(2) Date: Nov. 25, 2019

(87) PCT Pub. No.: WO2018/214963
PCT Pub. Date: Nov. 29, 2018

(65) Prior Publication Data
US 2020/0204172 A1 Jun. 25, 2020

(30) Foreign Application Priority Data
May 25, 2017 (CN) .......................... 201710381325.2

(51) Int. Cl.
*H03K 17/042* (2006.01)
*H03K 17/284* (2006.01)
*H03K 3/356* (2006.01)

(52) U.S. Cl.
CPC ..... *H03K 17/04206* (2013.01); *H03K 17/284* (2013.01); *H03K 3/356017* (2013.01); *H03K 2217/0036* (2013.01)

(58) Field of Classification Search
CPC .......... Y02B 70/1491; Y02B 70/1433; H02M 3/33592; H02M 3/33569; H03K 17/04206;
(Continued)

(56) References Cited

U.S. PATENT DOCUMENTS

2010/0141326 A1* 6/2010 Tumminaro ..... H03K 17/04123
327/374

* cited by examiner

*Primary Examiner* — Sibin Chen

(57) ABSTRACT

A low-power-consumption high-speed zero-current switch includes a delay controller, a driving stage and a power transistor MN, wherein: an input of the delay controller is connected with an external clock CLK, an output of the delay controller is connected with an input of the driving stage, and an output of the driving stage is connected with a gate of the power transistor MN; the delay controller includes a gate signal generator, a sampling circuit and a current controller, and three of which form a negative feedback loop for stabilizing the turn-on voltage $V_{ON}$ and the turn-off voltage $V_D$ to 0, so that when the power transistor MN is turned on or off, the source-drain voltage thereof is 0. The present invention no longer uses a high-power-consumption high-speed comparator, but uses a low-power-consumption delay controller to generate turn-on and turn-off signals of the power transistor.

5 Claims, 5 Drawing Sheets

(58) Field of Classification Search
CPC ............... H03K 17/284; H03K 17/133; H03K 3/356017; H03K 2217/0036; H03K 2217/0027; H03K 2005/00202
See application file for complete search history.

LOW-POWER-CONSUMPTION HIGH-SPEED ZERO-CURRENT SWITCH

CROSS REFERENCE OF RELATED APPLICATION

This is a U.S. National Stage under 35 U.S.C 371 of the International Application PCT/CN2018/088421, filed May 25, 2018, which claims priority under 35 U.S.C. 119(a-d) to CN 201710381325.2, filed May 25, 2017.

BACKGROUND OF THE PRESENT INVENTION

Field of Invention

The present invention relates to the field of integrated circuit design, and more particularly to a zero-current switch which mainly relates to discrete integrated circuits for automotive electronics and consumer products, and integrated circuit design in system-on-a-chip (SOC) applications such as biomedical implantable systems and consumer wireless power systems.

Description of Related Arts

Zero-current switches are widely used in various switching circuits, such as DC-DC converters, and active rectifiers. The function of the zero-current switch is that the current flowing through the switch is zero when the switch is turned on or off, thereby reducing the conduction loss of the switch and improving the reliability of the switch circuit.

The traditional zero-current switch is based on comparators. It generally includes a power MOSFET and a comparator. The power MOSFET generally includes NMOS transistors or PMOS transistors or a CMOS including NMOS transistors and PMOS transistors, and is a main path of the current. The circuit is connected or disconnected through turning on or off the power MOSFET. The comparator is configured to control the turn-on and turn-off of the power MOSFET by comparing the voltage across the power MOSFET. When the voltage across the comparator is zero, the power MOSFET is switched between turn-on and turn-off states, so that the current flowing through the power MOSFET at the time of switching is zero.

Conventional zero-current switches require higher speeds in comparators when faced with high speed requirements such as high frequency active rectifiers and high frequency DC-DC. However, high-speed comparators consume more power, so more literature is devoted to implementing low-power-consumption high-speed comparators and solving problems of high-speed comparators with low power consumption.

Literature "*An efficiency-enhanced CMOS rectifier with unbalanced-biased comparators for transcutaneous-powered high-current implants,*" (S. Guo and H. Lee, *IEEE JOURNAL OF SOLID-STATE CIRCUITS, VOL.* 44, NO. 6, JUNE 2009) disclosed that through a non-balanced bias current method, a fixed offset voltage VOS is introduced at an input of the comparator to achieve an advanced comparison of the comparator at a turn-off edge, thereby achieving an advanced turn-off of the zero-current switch at a lower power consumption, for further increasing the turn-off speed of the zero-current switch.

Literature "*An integrated power-efficient active rectifier with offset-controlled high speed comparators for inductively-powered applications,*" (H. Lee and M. Ghovanloo, *IEEE TRANSACTIONS ON CIRCUITS AND SYSTEMS—I: REGULAR PAPERS, VOL.* 58, NO 8. AUGUST 2011) disclosed that based on the above research, by controlling the turn-on and turn-off of the unbalanced current, two offset voltages VOS+ and VOS− are dynamically introduced at the inputs of the comparator to achieve the advanced turn-on and turn-off of the zero-current switch under certain power consumption control. The speed-up zero-current switch allows the active rectifier which includes the zero-current switch to operate at 13.56 MHz, which is within the bandwidth specified by industrial, scientific, and medical-specific frequencies (ISM) for applications in implantable systems. However, the comparator is unstable due to the two advanced offset voltages, so that multiple pulse problems are generated in the software simulation, and during the actual application, the circuit which includes the zero-current switch fails due to the oscillation.

Literature "A 13.56 MHz *CMOS Active Rectifier With Switched-Offset and Compensated Biasing for Biomedical Wireless Power Transfer Systems,*" (Lu Yan and Ki Wing-Hung, *IEEE Trans Biomed Circuits Syst, vol.* 8, pp. 334-44, June 2014) pointed out the multiple pulse and instability problems caused by the comparator using two offset voltages in the previous literature, and solved the problems by means of Switched-Offset. However, in this literature, only the double offset voltages of VOS+-VOS− in the previous literature is reduced to 0-VOS−, which reduces the probability of instability of the active rectifier, and does not fundamentally solve the stability problem caused by the double offset voltages.

Literature "*Adaptive On/Off Delay-Compensated Active Rectifiers for Wireless Power Transfer Systems,*" (Lin Cheng, Wing-Hung Ki, Yan Lu, Tak-Sang Yim, *IEEE Journal of Solid-State Circuits, vol.* 51, pp. 712-723, 2016) and literature: "A Near-Optimum 13.56 MHz *CMOS Active Rectifier With Circuit-Delay Real-Time Calibrations for High-Current Biomedical Implants,*" (Cheng Huang, Tom Kawajiri, Hiroki Ishikuro, *IEEE Journal of Solid-State Circuits, vol.* 51, pp. 1797-1809, 2016) discloses that based on the previous research, the negative feedback control technique is used to adaptively control the magnitude of the unbalanced current to control the magnitude of the offset voltage, namely, to control the compensated delay, so as to increase the speed of the zero-current switch. The conversion efficiency of the active rectifier using this zero-current switch is also increased to about 90%. For the problem of instability caused by double offset voltages, literature "*Adaptive On/Off Delay-Compensated Active Rectifiers for Wireless Power Transfer Systems,*" (Lin Cheng, Wing-Hung Ki, Yan Lu, Tak-Sang Yim, *IEEE Journal of Solid-State Circuits, vol.* 51, pp. 712-723, 2016) disclosed a one-shot circuit which utilizes the feedback set to eliminate unstable multiple pulses. However, since the one-shot circuit utilizes a feedback signal, the feedback signal competes with the input of the comparator. Once the feedback signal is later than the input of the comparator in the time domain, multiple pulses will still be generated.

Traditional zero-current switches need to increase the speed of the comparator when faced with high-speed demands. However, high-speed comparators generally generate large power consumption. The comparators based on double offset voltages used in many literatures are able to achieve faster comparisons at lower power consumption, but the double offset voltages cause the instability of the zero-current switch and affect the reliability thereof. In addition, because the offset voltage is able to provide limited delay time compensation, the comparator in the zero-current switch still consumes a relatively large amount of power.

SUMMARY OF THE PRESENT INVENTION

An object of the present invention is to provide a low-power-consumption high-speed zero-current switch for solving technical problems in existing high-speed zero-current switches.

To achieve the above object, the present invention provides a technical solution as follows.

A low-power-consumption high-speed zero-current switch comprises a delay controller, a driving stage and a power transistor MN, wherein: an input of the delay controller is connected with an external clock CLK, an output of the delay controller is connected with an input of the driving stage, and an output of the driving stage is connected with a gate of the power transistor MN;

the delay controller comprises a gate signal generator, a sampling circuit and a current controller;

the gate signal generator is configured to use the external clock CLK and two currents $I_{ON}$ and $I_D$ controlled by the current controller to generate a gate signal $V_{GN}$ of the power transistor MN required by the zero-current switch; the sampling circuit comprises a sampling logic unit and a switched capacitor sampling unit; the sampling logic unit is configured to utilize the external clock CLK and the gate signal $V_{GN}$ of the power transistor MN to control the switched capacitor sampling unit for sampling source-drain voltages of the zero-current switch at turn-on and turn-off moments thereof, and then transmit a sampled turn-on voltage $V_{ON}$ and a sampled turn-off voltage $V_D$ to the current controller; the current controller is configured to utilize the turn-on voltage $V_{ON}$ and the turn-off voltage $V_D$ to adaptively adjust the two currents $I_{ON}$ and $I_D$, respectively; the gate signal generator, the sampling circuit and the current controller form a negative feedback loop for stabilizing the turn-on voltage $V_{ON}$ and the turn-off voltage $V_D$ to 0, so that when the power transistor MN is turned on or off, a source-drain voltage thereof is 0.

Further, the gate signal generator comprises two cascaded current control delay line (CCDL) units, two single pulse generators and an SR (set-reset) latch, wherein: the two cascaded current control delay line (CCDL) units are respectively a first CCDL unit and a second CCDL unit; an input of the first CCDL unit is connected with CLK, a current control terminal of the first CCDL unit is connected with $I_{ON}$, an output of the first CCDL unit is connected with an input of a second CCDL unit and an input of a first single pulse generator; a current control terminal of the second CCDL unit is connected with $I_D$, an output of the second CCDL unit is connected with an input of the second single pulse generator; the first single pulse generator and the second single pulse generator respectively output two pulse signals $P_{RA}$ and $P_{FA}$ to two inputs of the SR latch, and an output of the SR latch outputs the gate signal $V_{GN}$ of the power transistor MN.

Further, the first CCDL unit is controlled by $I_{ON}$ to adjust the turn-on time of the gate signal; the second CCDL unit is controlled by $I_D$ to adjust the turn-off time of the gate signal.

Further, both of the first and second single pulse generators are configured to restore the gate signal after being delayed to a short pulse, and transmit the short pulse to the SR latch for generating the required gate signal $V_{GN}$.

Further, the current controller comprises a level shifting circuit, a first comparator CMP1, a second comparator CMP2, a logic control circuit, a current-switching integrator, a voltage to current converter and a current subtractor connected with each other in sequence, wherein: the two voltages $V_{ON}$ and $V_D$ are respectively introduced to two inputs of the level shifting circuit, and two outputs of the current subtractor respectively output the two currents $I_{ON}$ and $I_D$.

Compared with the prior art, the present invention has beneficial effects as follows. The present invention no longer uses a high-power-consumption high-speed comparator, but uses a low-power-consumption delay controller to generate turn-on and turn-off signals of the power transistor, so that the present invention is able to increase the speed of the zero-current switch at low-power-consumption. In addition, the low-power-consumption negative feedback circuit is used to control the delay of the zero-current switch, so as to ensure zero-current characteristics of the power transistor while being turned on and turned off. At the same time, due to the negative feedback characteristic of the delay controller, the robustness and the stability of the zero-current switch are greatly improved.

DETAILED DESCRIPTION OF THE PREFERRED EMBODIMENT

Figure 1:
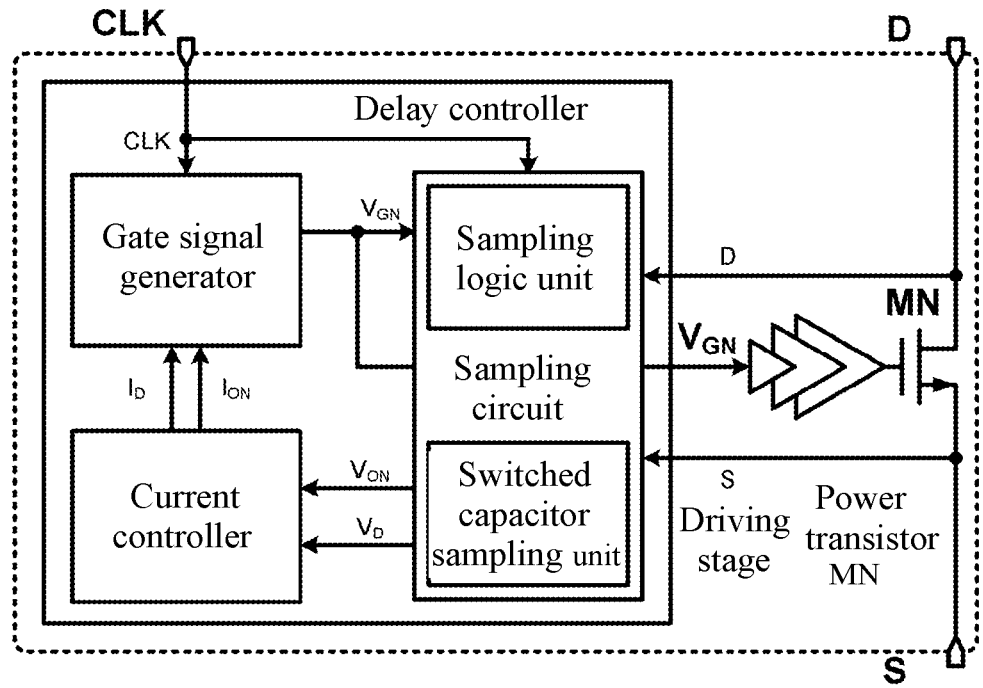
FIG. 1 is a structurally schematic view of a zero-current switch provided by the present invention.

Referring to FIG. 1, a low-power-consumption high-speed zero-current switch according to a preferred embodiment of the present invention is illustrated, which is able to produce turn-on and turn-off signals of a power transistor through a delay circuit; and control a delay through a negative feedback circuit to ensure that zero-current characteristics when the power transistor is turned on and off.

FIG. 1 is a structurally schematic view of the low-power-consumption high-speed zero-current switch according to the preferred embodiment of the present invention, which comprises a delay controller, a driving stage and a power transistor MN. The power transistor MN is a main component of the low-power-consumption high-speed zero-current switch. Since the power transistor has a large gate parasitic capacitance, the delay controller is unable to be directly driven; and the driving stage is able to enhance a driving capability of signals, so that after an output signal of an active circuit passes through the driving stage, the power transistor with larger gate parasitic capacitance is driven. The delay controller generates a power-stage gate signal by means of delay control, and controls and maintains the stability of the gate signal at rising and falling times through negative feedback.

FIG. 1 is a structurally schematic view of the zero-current switch of the present invention, which comprises the delay controller, the driving stage and the power transistor MN. An input of the delay controller is connected with an external clock CLK, an output of the delay controller is connected with an input of the driving stage, and an output of the driving stage is connected with a gate of the power transistor MN.

The delay controller comprises a gate signal generator, a sampling circuit and a current controller.

The gate signal generator uses the external clock CLK and two currents $I_{ON}$ and $I_D$ controlled by the current controller to generate a gate signal $V_{GN}$ of the power transistor MN required by the zero-current switch. The sampling circuit comprises a sampling logic unit and a switched capacitor sampling unit. The sampling logic unit utilizes the external clock CLK and the gate signal $V_{GN}$ of the power transistor MN to control the switched capacitor sampling unit for sampling a voltage difference between a source (S) and a drain (D) of the zero-current switch at turn-on and turn-off moments thereof, and then transmits a sampled turn-on voltage $V_{ON}$ and a sampled turn-off voltage $V_D$ to the current controller. The current controller utilizes the turn-on voltage $V_{ON}$ and the turn-off voltage $V_D$ to adaptively adjust the two currents $I_{ON}$ and $I_D$, respectively. The gate signal generator, the sampling circuit and the current controller form a negative feedback loop for stabilizing the turn-on voltage $V_{ON}$ and the turn-off voltage $V_D$ to 0, so that when the power transistor MN is turned on or off, the source-drain voltage thereof is 0, thereby achieving zero-current turn-on and turn-off.

Figure 2:
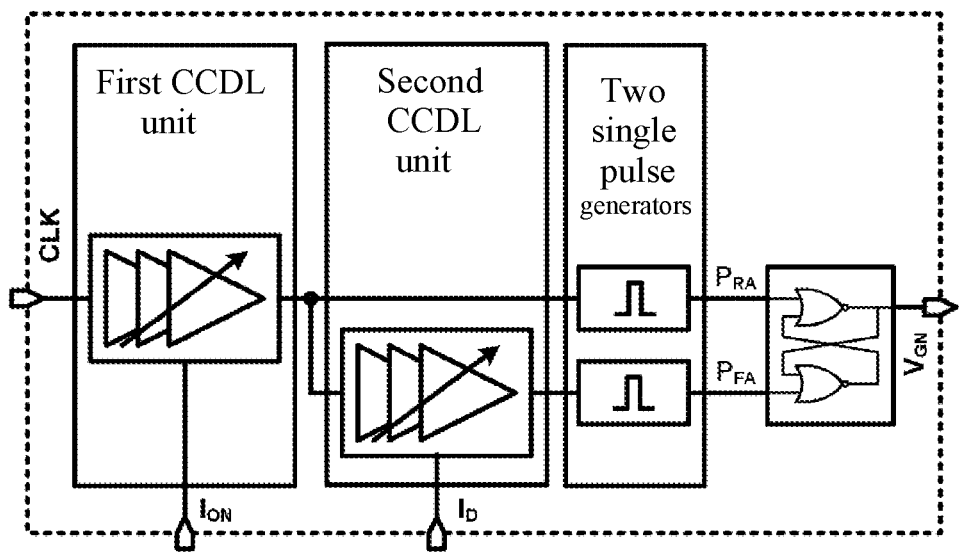
FIG. 2 is a structurally schematic view of a gate signal generator of the zero-current switch provided by the present invention.

FIG. 2 is a structurally schematic view of the gate signal generator, which comprises two cascaded current control delay line (CCDL) units, two single pulse generators and an SR (set-reset) latch. An input of a first current control delay line (CCDL) unit is connected with CLK, a current control terminal of the first CCDL unit is connected with $I_{ON}$, an output of the first CCDL unit is connected with an input of a second CCDL unit and an input of a first single pulse generator; a current control terminal of the second CCDL unit is connected with $I_D$, an output of the second CCDL unit is connected with an input of the second single pulse generator; the first single pulse generator and the second single pulse generator respectively output two pulse signals $P_{RA}$ and $P_{FA}$ to two inputs of the SR latch, and an output of the SR latch outputs the gate signal $V_{GN}$ of the power transistor MN.

Figure 3:
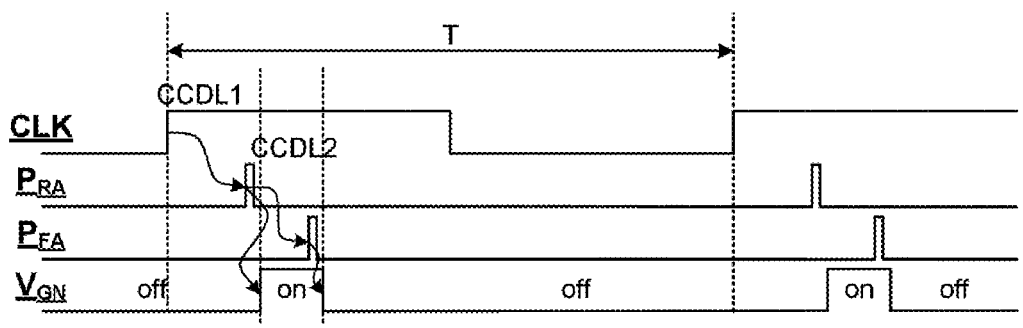
FIG. 3 is a waveform diagram of key nodes in the gate signal generator.

The first CCDL unit is controlled by $I_{ON}$ to adjust the turn-on time of the gate signal; the second CCDL unit is controlled by $I_D$ to adjust the turn-off time of the gate signal, as shown in FIG. 3. Both of the first and second single pulse generators restore a delayed signal to a short pulse, and transmit the short pulse to the SR latch for generating the required gate signal $V_{GN}$.

Figure 4:
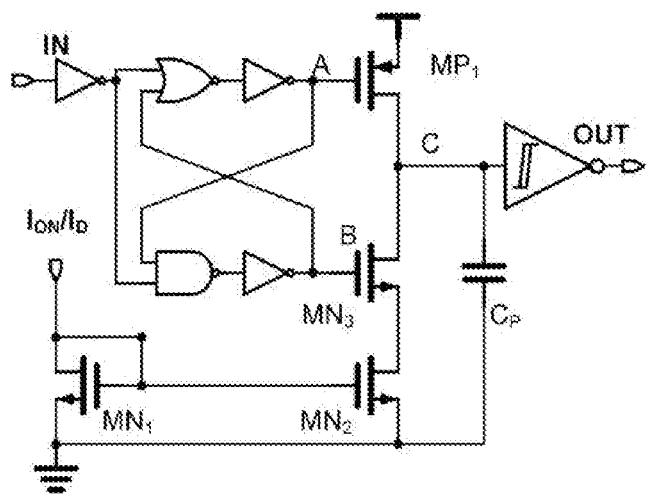
FIG. 4 is a structurally schematic view of any one of the first and second CCDL units of the gate signal generator.
Figure 5:
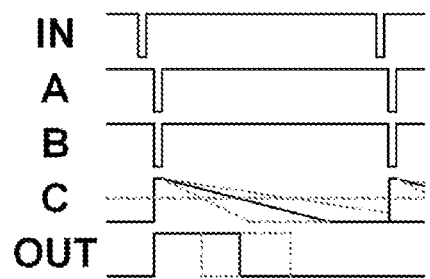
FIG. 5 is a waveform diagram of key nodes in any one of the first and second CCDL units.

FIG. 4 is a structurally schematic view of any one of the first and second CCDL units of the gate signal generator. MN1 and MN2 form a current mirror. MN2 mirrors the current $I_{ON}$ or $I_D$ which passes through MN1. The first and second CCDL units control a discharge rate of a capacitor CP through controlling the current $I_{ON}$ or $I_D$. When the voltage on the capacitor drops to a certain level, the output voltage OUT flips. Different currents mean different discharge rates and different delay times, as shown in FIG. 5.

Figure 6:
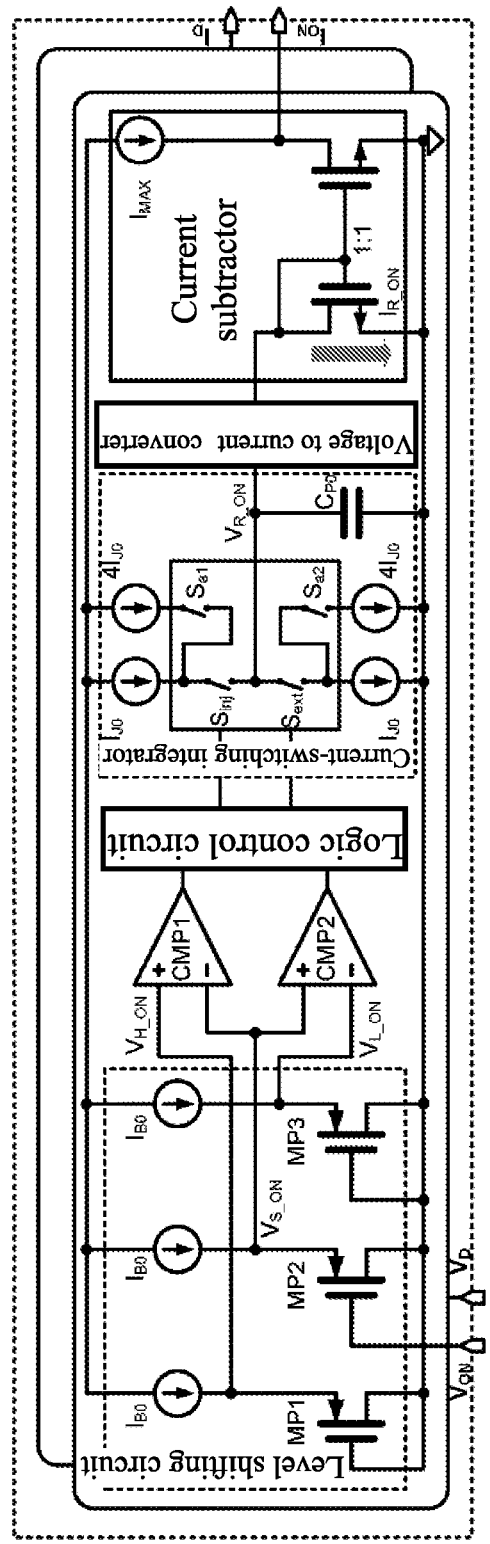
FIG. 6 is a structurally schematic view of a current controller of the zero-current switch provided by the present invention.
Figure 7:
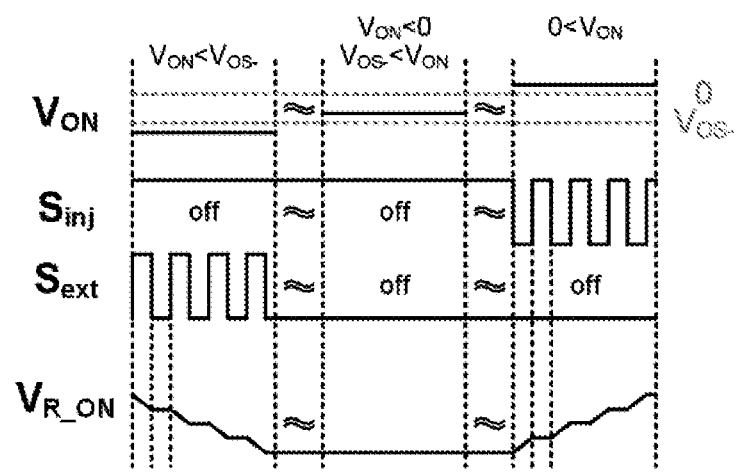
FIG. 7 is a waveform diagram of key nodes in the current controller.
Figure 8:
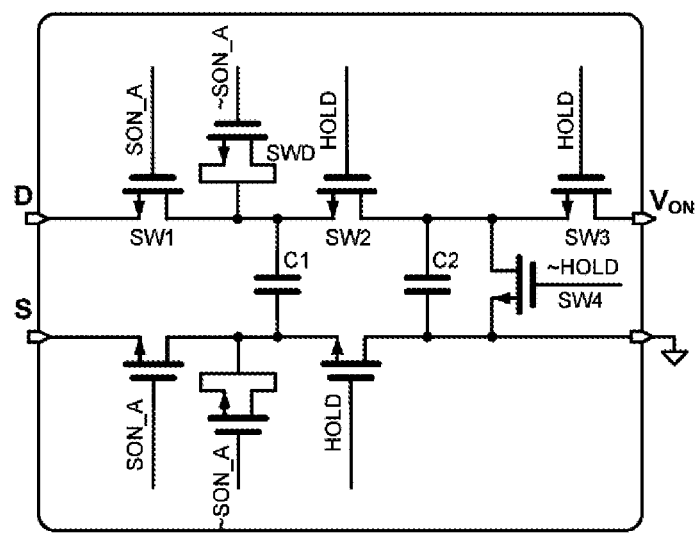
FIG. 8 is a topologically schematic view of a switched capacitor sampling unit of the zero-current switch provided by the present invention.

FIG. 6 is a structurally schematic view of the current controller, which comprises a level shifting circuit, a first comparator CMP1, a second comparator CMP2, a logic control circuit, a current-switching integrator, a voltage to current converter and a current subtractor connected with each other in sequence. The level shifting circuit converts a sampled voltage $V_{ON}$ ($V_D$) into a higher voltage $V_{ON\_S}$ ($V_{D\_S}$) and provides two reference voltages $V_{ON\_H}$ and $V_{ON\_L}$ ($V_{D\_H}$ and $V_{D\_L}$). A voltage window ranges from $V_{OS-}$ to 0 is introduced equivalently at an input node of the level shifting circuit through $V_{ON\_H}$ and $V_{ON\_L}$. The comparators CMP1 and CMP2 respectively compare $V_{ON\_S}$ with $V_{ON\_H}$ and $V_{ON\_L}$, which is equivalent to comparing $V_{ON}$ with $V_{OS-}$ and 0, respectively. Moreover, the comparators CMP1 and CMP2 output digital codes for controlling turning on and turning off switches $S_{inj}$ and $S_{ext}$ of the current-switching integrator, thereby adjusting $V_{R\_ON}$. Through the voltage to current converter and the current subtractor, the voltage change of $V_{R\_ON}$ is able to adjust the current $I_{ON}$. FIG. 7 is a waveform diagram of key nodes in the current controller.

The zero-current switch provided by the present invention generates the gate signal of the power transistor through the delay controlled by the current, thereby avoiding the use of a high-power-consumption comparator. Due to the successive approximation negative feedback technique, the zero-current switch based on the delay controller is able to achieve a higher switching speed at lower power consumption. The low-power-consumption high-speed zero-current switch facilitates improving performances of other circuits which adopt this switch.

Figure 9:
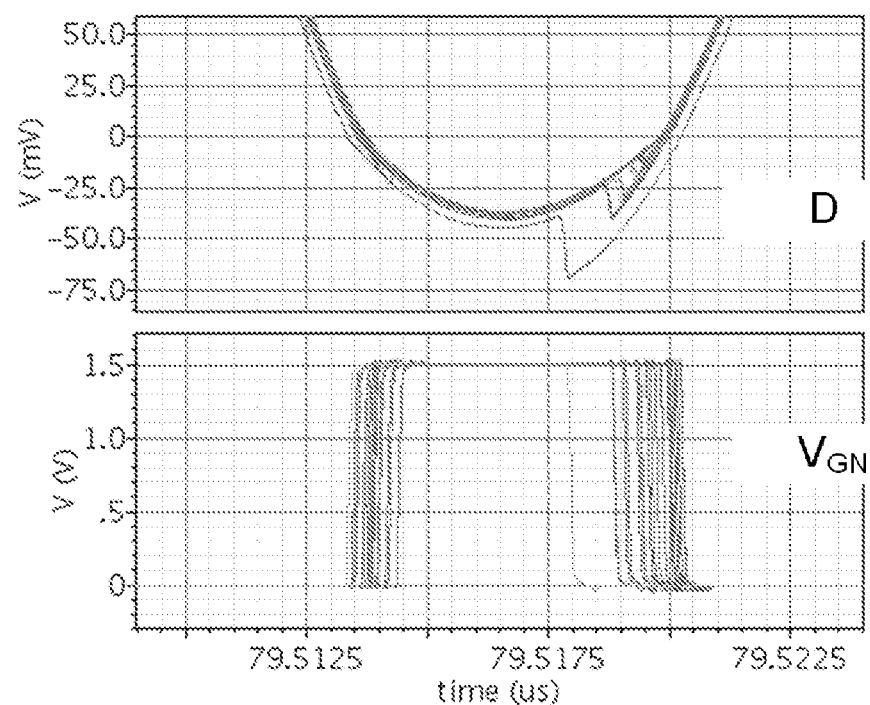
FIG. 9 is a Montecarlo simulation waveform when a source (S) of the zero-current switch is connected with ground.

In addition, the negative feedback mechanism inside the delay controller enables the active rectifier to have a good resistance to process variations, and has strong process robustness, as shown in FIG. 9.

What is claimed is:

1. A low-power-consumption high-speed zero-current switch, which comprises a delay controller, a driving stage and a power transistor (MN), wherein: an input of the delay controller is connected with an external clock (CLK), an output of the delay controller is connected with an input of the driving stage, and an output of the driving stage is connected with a gate of the power transistor (MN);

the delay controller comprises a gate signal generator, a sampling circuit and a current controller;

the gate signal generator is configured to use the external clock (CLK) and two currents ($I_{ON}$) and ($I_D$) controlled by the current controller to generate a gate signal ($V_{GN}$) of the power transistor (MN) required by the zero-current switch; the sampling circuit comprises a sampling logic unit and a switched capacitor sampling unit; the sampling logic unit is configured to utilize the external clock (CLK) and the gate signal ($V_{GN}$) of the power transistor (MN) to control the switched capacitor sampling unit for sampling source-drain voltages of the zero-current switch at turn-on and turn-off moments thereof, and then transmit a sampled turn-on voltage ($V_{ON}$) and a sampled turn-off voltage ($V_D$) to the current controller; the current controller is configured to utilize the turn-on voltage ($V_{ON}$) and the turn-off voltage ($V_D$) to adaptively adjust the two currents ($I_{ON}$) and ($I_D$), respectively; the gate signal generator, the sampling circuit and the current controller form a negative feedback loop for stabilizing the turn-on voltage ($V_{ON}$) and the turn-off voltage ($V_D$) to 0, so that when the power transistor (MN) is turned on or off, a source-drain voltage thereof is 0.

2. The low-power-consumption high-speed zero-current switch, as recited in claim 1, wherein: the gate signal generator comprises two cascaded current control delay line (CCDL) units, two single pulse generators and an SR (set-reset) latch; the two cascaded current control delay line (CCDL) units are respectively a first CCDL unit and a second CCDL unit; an input of the first CCDL unit is connected with the external clock (CLK), a current control terminal of the first CCDL unit is connected with the current ($I_{ON}$), an output of the first CCDL unit is connected with an input of the second CCDL unit and an input of a first single pulse generator; a current control terminal of the second CCDL unit is connected with the current ($I_D$), an output of the second CCDL unit is connected with an input of the second single pulse generator; the first single pulse generator and the second single pulse generator respectively output two pulse signals ($P_{RA}$) and ($P_{FA}$) to two inputs of the SR latch, and an output of the SR latch outputs the gate signal ($V_{GN}$) of the power transistor (MN).

3. The low-power-consumption high-speed zero-current switch, as recited in claim 2, wherein: the first CCDL unit is controlled by the current ($I_{ON}$) to adjust a turn-on time of the gate signal; the second CCDL unit is controlled by the current ($I_D$) to adjust a turn-off time of the gate signal.

4. The low-power-consumption high-speed zero-current switch, as recited in claim 3, wherein: both of the first and second single pulse generators are configured to restore the gate signal after being delayed to a short pulse, and transmit the short pulse to the SR latch for generating the required gate signal ($V_{GN}$).

5. The low-power-consumption high-speed zero-current switch, as recited in claim 1, wherein: the current controller comprises a level shifting circuit, a first comparator (CMP1), a second comparator (CMP2), a logic control circuit, a current-switching integrator, a voltage to current converter and a current subtractor connected with each other in sequence, wherein:

the two voltages ($V_{ON}$) and ($V_D$) are respectively introduced to two inputs of the level shifting circuit, and two outputs of the current subtractor respectively output the two currents ($I_{ON}$) and ($I_D$).

* * * * *